(12) United States Patent
Wang et al.

(10) Patent No.: US 6,365,435 B1
(45) Date of Patent: Apr. 2, 2002

(54) METHOD FOR PRODUCING A FLIP CHIP PACKAGE

(75) Inventors: Tie Wang; Colin Chun Sing Lum, both of Singapore (SG)

(73) Assignee: Advanpack Solutions PTE LTD, Singapore (SG)

( * ) Notice: Subject to any disclaimer, the term of this patent is extended or adjusted under 35 U.S.C. 154(b) by 0 days.

(21) Appl. No.: 09/815,241

(22) Filed: Mar. 22, 2001

(30) Foreign Application Priority Data

Dec. 4, 2000 (SG) ..................................... 200007117-5

(51) Int. Cl.[7] .......................... H01L 21/44; H01L 21/48; H01L 21/50

(52) U.S. Cl. .................. 438/108; 438/612; 438/974

(58) Field of Search ............................... 438/108, 612, 438/974

(56) References Cited

U.S. PATENT DOCUMENTS 5,795,818 A * 8/1998 Marrs
6,133,066 A * 10/2000 Murakami
6,163,463 A * 12/2000 Marrs

* cited by examiner

*Primary Examiner*—John F. Niebling
*Assistant Examiner*—Josetta I. Jones
(74) *Attorney, Agent, or Firm*—Liu & Liu LLP

(57) ABSTRACT

In a no-flow underfill process 400, a substrate 10 is heated to an elevated temperature prior to dispensing underfill 5 thereon. The underfill 5 flows more readily over mask portions 20 and conductors 25 on the substrate 10, filling in spaces between the conductors 25 and the masking portions 20, thereby preventing air from being trapped thereabout. In addition, when a bumped die 40 is heated during placement on the substrate 10 with the underfill 5 therebetween, the underfill 5 flows around bumps 45 more readily thereby preventing air from being trapped thereabout. The result is a flip chip semiconductor package having a lower void density.

30 Claims, 4 Drawing Sheets

METHOD FOR PRODUCING A FLIP CHIP PACKAGE

FIELD OF THE INVENTION

The present invention relates to producing a flip chip semiconductor package and more particularly to a method of applying underfill when producing such a package.

BACKGROUND OF THE INVENTION

Flip chip semiconductor packages are known. A flip chip package comprises a semiconductor chip or die which has a pattern of pads on one surface; a substrate with a corresponding pattern of conductors on a first surface, and a second surface, opposite the first surface, with a pattern of external conductors; interconnects that couple the pads to the conductive locations; and underfill that fills the gap between the die and the substrate.

A first, and relatively well known, method of forming the flip chip package is to raise or bump the pads on the semiconductor die, then flip the chip over and place it with the bumps on the pattern of conductors. When the bumps are deposits or layers of solder, or solder balls, the assembly is heated and the solder between the pads and conductors melts to form an interconnect between a pad and a corresponding conductor.

Typically, the underfill is an epoxy based liquid whose viscosity will significantly decrease with raising temperature. The underfill is applied at the edges of the flipped die, and through capillary action the underfill is drawn in and flows into the gap. The process of filling the gap with underfill presents a variety of difficulties, most of which relate to the incomplete filling of the gap with the underfill.

A second method of forming a flip chip package attempts to shorten the process flow and in particular overcome the problem of applying underfill by using so called, no-flow underfill. With this method, the no-flow underfill is applied to the first surface of the substrate before the bumped surface of the die is placed on the substrate. This method substantially addresses the problems and difficulties associated with incomplete filling of the gap between the substrate and the die encountered using the first method.

However, it has been found that this method results in air bubbles being trapped in the no-flow underfill. Air bubbles cause voids in the completed flip chip semiconductor packages, and voids, as with the first method, affects the reliability and cosmetics of the flip chip semiconductor package.

In industry, customers of such packages specify a tolerable void criterion in a package in terms of the size of voids and the distribution of the voids. Packages with a void count and distribution which exceeds the specified criteria are rejected. A known criteria is, no bump can be totally isolated from underfill. In other words, a bump should not have a void surround it. Hence, there is a need to control the void formation in flip chip semiconductor packages in order to meet the void criteria and produce more reliable packages.

BRIEF SUMMARY OF THE INVENTION

The present invention seeks to provide a method for producing a flip chip semiconductor package, which overcomes or at least reduces the abovementioned problems of the prior art.

Accordingly, in one aspect, the present invention provides a method for forming a flip-chip semiconductor package, the method comprising the steps of:

a) providing:
  i) a semiconductor die having a plurality of pads thereon, wherein the pads are arranged in a pattern, and wherein at least some of the plurality pads has at least one conductive bump thereon;
  ii) a substrate having a plurality of conductive locations thereon, wherein at least some of the plurality of conductive locations are arranged in a corresponding pattern, the at least some of the plurality of conductive locations for receiving at least some of the bumps; and
  iii) underfill;
b) heating the substrate to an elevated temperature relative to the temperature of the underfill while dispensing the underfill on the substrate; and
c) placing the semiconductor die on the substrate with the underfill therebetween, wherein the at least some of the plurality of pads are substantially aligned with the at least some of the plurality of conductive locations.

In another aspect the present invention provides a method for forming a flip-chip semiconductor package, the method comprising the steps of:

a) providing:
  i) a semiconductor die having a plurality of pads thereon, wherein at least some of the plurality of pads are arranged in a pattern;
  ii) a bumped substrate having a plurality of conductive locations thereon, wherein at least some of the plurality of conductive locations are arranged in a corresponding pattern, and wherein at least some of the plurality of conductive locations has at least one conductive bump thereon, the at least some of the plurality of conductive locations for coupling to at least some of the plurality of pads; and
  iii) underfill;
b) heating the bumped substrate to an elevated temperature relative to the temperature of the underfill while dispensing the underfill on the bumped substrate; and
c) placing the semiconductor die on the bumped substrate with the underfill therebetween, wherein the at least some of the plurality of pads are substantially aligned with the at least some conductive locations.

BRIEF DESCRIPTION OF THE DRAWINGS

An embodiment of the present invention will now be fully described, by way of example, with reference to the drawings of which.

DETAIL DESCRIPTION OF THE DRAWINGS

The prior art method of forming a flip chip semiconductor package using no-flow underfill is presented, where during the application of the no-flow underfill on a substrate air is trapped between solder mask and bond pad, and when a bumped die and the substrate come together, air is again trapped around the bumps, and the trapped air appears as bubbles. A method of forming a flip chip semiconductor package with no-flow underfill in accordance with the present invention is then described, which reduces the amount of air that is trapped, and thus, advantageously reduces the resultant bubbles.

Figure 1:
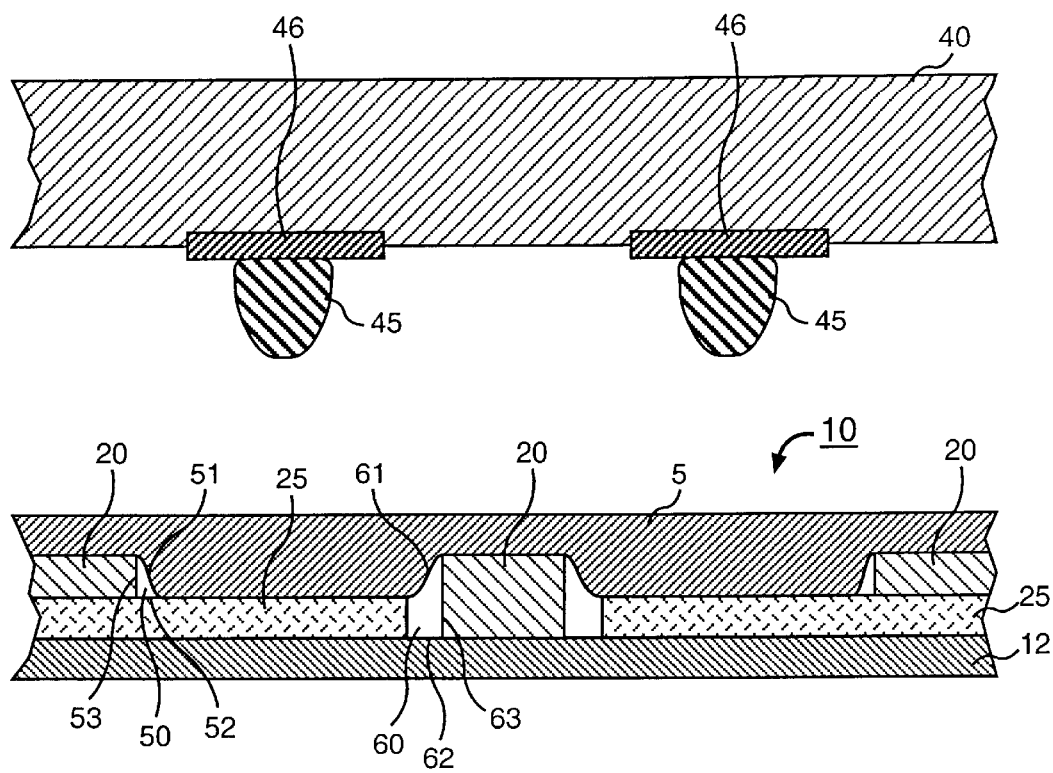
FIG. 1 shows a cross-sectional view of a die and a substrate before assembly in accordance with the prior art.

In FIG. 1 when no-flow or compressive flow underfill 5 is applied on a substrate 10. The substrate 10 comprises a non-conductive base 12 with patterned mask portions 20 and patterned conductors 25 layered thereon, as is known in the art. Upon application, the dispensed underfill 5 flows over upper surfaces of mask portions 20 and conductors 25. The mask portions 20 are relatively higher than the conductors 25 because the conductors 25 are down set from the upper surface of the mask portions 20. In addition, there is space between the ends of conductors 25 and the mask portions 20. Due to the relatively high viscosity of the underfill 5, and the relatively small dimensions of the down set of the conductors 25, air is trapped in a space 50 formed between lower surface 51 of the underfill 5, upper surface 52 of conductors 25, and side surface 53 of the mask portions 20 surrounding the conductor 25. In addition, air is also trapped in a space 60 between the ends of conductors 25, lower surface 61 of the underfill 5, side surface 63 of the mask portions 20, and the upper surface 62 of the base 12.

A die 40 with bumps 45 on pads 46, is then placed on the substrate 10, with the bumps 45 abutting the conductors 25, and heat and pressure is applied to melt the bumps 45 and form interconnects between the pads 46 and the conductors 25.

Figure 2:
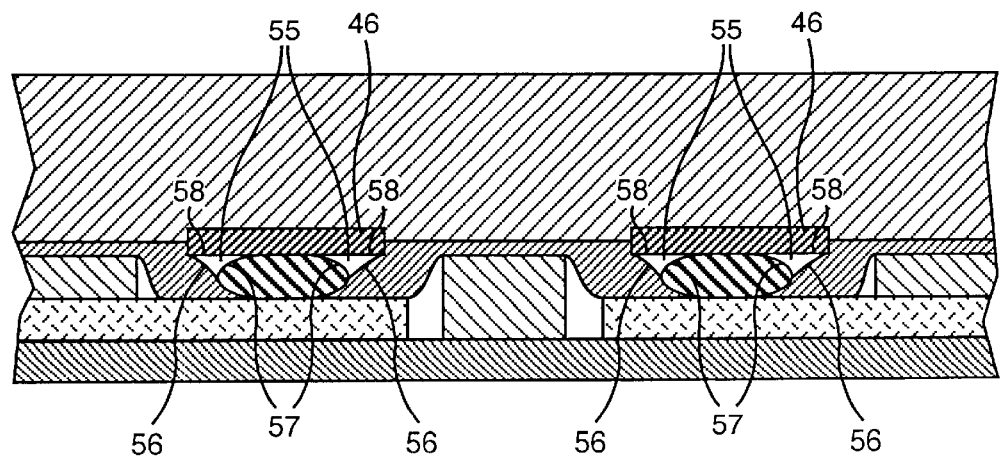
FIG. 2 shows a cross sectional view of the die and the substrate in FIG. 1 after assembly.

In FIG. 2, when the bumps 45 are pushed against the layer of underfill 5 on the conductors 25, the underfill 5 is squeezed upwards around the bumps 45 trapping air in space 55 between upper surface 56 of the underfill 5, sides of the bumps 57, and lower surface 58 of the die pad 46.

When air is trapped in the spaces 50, 55 and 60, there is no means for the air to escape or to be forced out after the die 40 has been placed on the substrate 10, in the conventional flip chip packaging process with no-flow underfill. Consequently, when the assembly, comprising the die 40, the substrate 10, and the layer of underfill 5, is heated, the air remains in the spaces 50, 55 and 60. Consequently, when the assembly forms a flip chip package, the spaces 50, 55 and 60 appear as voids in the underfill 5, where the voids surround the bumps 45 on both the die side and the substrate side.

Figure 3:
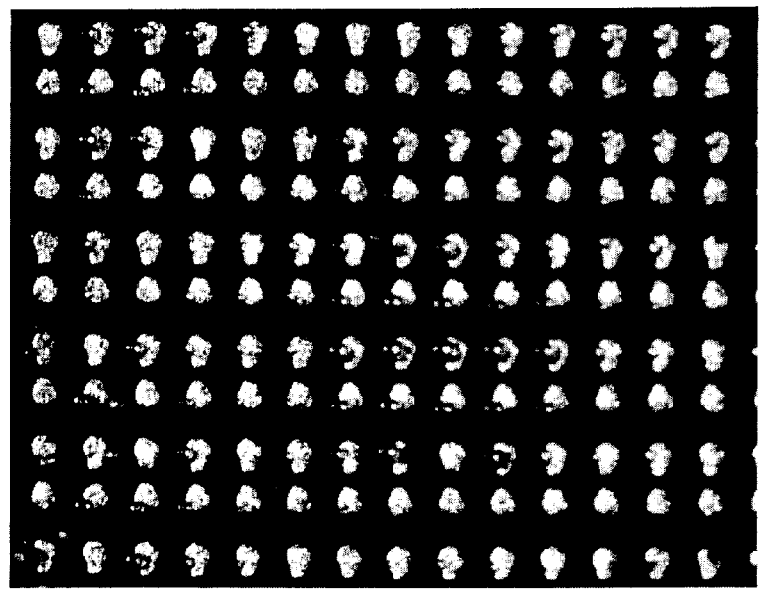
FIG. 3 shows a photograph of the substrate in FIG. 1 after dispensing underfill in accordance with the prior art.

FIG. 3 shows a photograph, which was taken using a scanning acoustic microscope, shows a plan view of the substrate 10 after underfill 5 was dispensed. In the photograph, the arrays of spots are the conductors 25 to which the die pads 46 are to be attached with the solder bumps 45. It will be observed that there are circular and transparent objects proximal to most of the conductors 25. The objects that appear circular and transparent are air bubbles trapped in the underfill 5.

Figure 4:
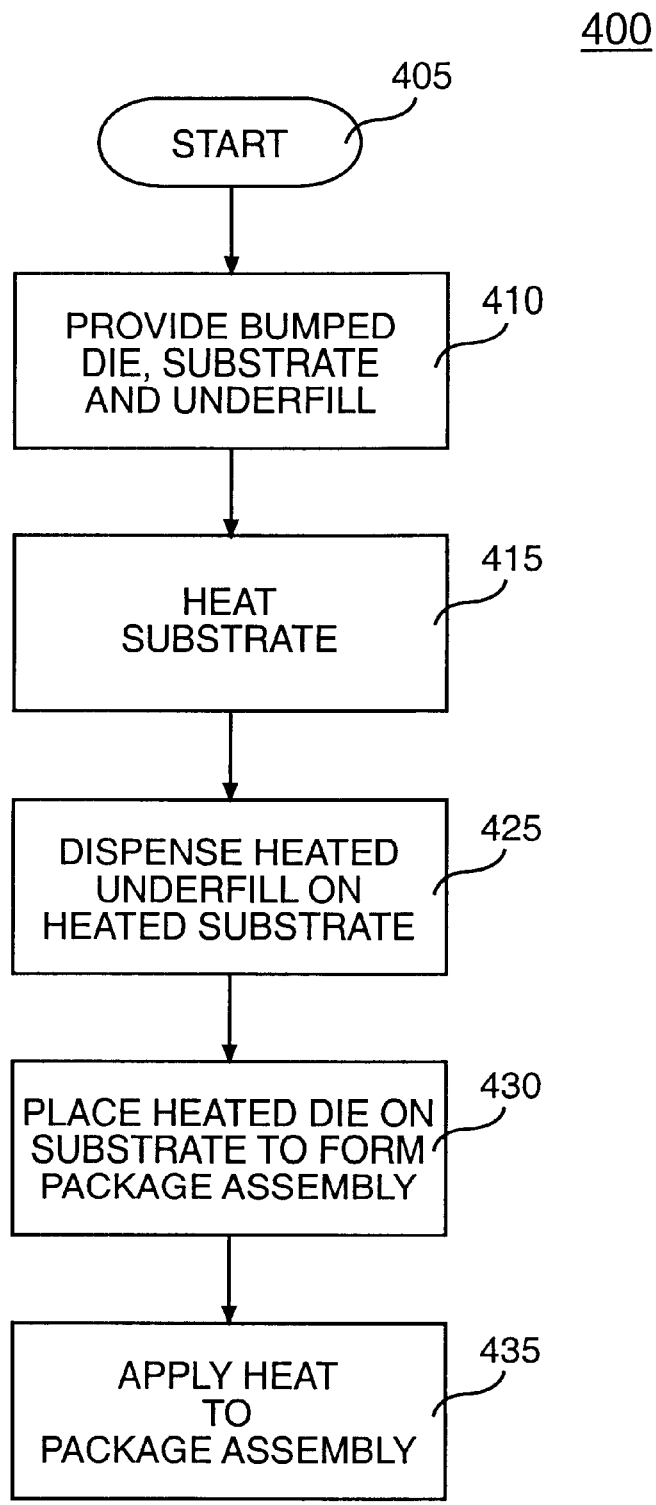
FIG. 4 shows a flow chart detailing a process for forming a flip chip semiconductor package in accordance with the present invention.

With additional reference to FIG. 4 a method 400 of forming a flip chip semiconductor package, in accordance with the present invention, starts 405 with the step of providing 410 the bumped semiconductor die 40, the substrate 10 and underfill 5 for assembly. The substrate 10 is heated 415 to a predetermined elevated temperature, approximately 80~120 degrees Celsius, prior to underfill dispensing. After the substrate surface has been heated up, the underfill 5 will flow more readily over the upper surfaces of the substrate 10, particularly the surface of the mask portions 20 and the surface of the conductors 25. The underfill 5 now fills in the spaces 50 and 60, thereby reducing the likelihood of trapping air in these spaces between the underfill 5, the conductors 25 on the substrate 10, and the mask portions 20 surrounding the conductors 25.

In addition, the no-flow underfill 5 inherently possesses slow curing characteristics, thus, minimum curing reaction will occur at the aforementioned setting temperature to deteriorate the material properties of the no-flow underfill 5.

Heat can be applied to the substrate 10 via electric heating elements (not shown) located in a substrate holding area (not shown) prior to attaching the die 40 to the substrate 10. Electric heating elements can also be incorporated in the die attach or die bonding area or stage, where the die 40 is attached or mounted on the pre-heated substrate 10 to ensure that the substrate 10 is maintained at the elevated temperature. In order to enhance the heating effect, the underfill is heated during dispensing 425. This can be accomplished using temperature control techniques that are known in the art.

Next, the die 40 is placed 430 on the substrate after bumps on the die are aligned with the conductors on the substrate 10. Again, the die 40 may be heated to remove the trapped air bubbles around bumps 45 during die placement. The die 40 can be heated by introducing a heating element into a bonding head that picks and places the die 40 on the substrate 10. As is known in the art, pressure may be applied to the die 40 and the substrate 10 when bringing them together.

Heating the substrate 10, the semiconductor die 40, and the underfill 5 results in the viscosity of the underfill approximating 25 Centipoises, in order for the underfill to flow into, and fill, the spaces 50, 55 and 60.

The assembly of die 40, underfill 5 and substrate 10, is then heated 435 to reflow the bumps 45 to form electrical interconnects between the pads 46 on the die 40 and the conductors 25 on the substrate. The heating during reflow also cures the underfill, as is known in the art.

Hence, the process 400, in accordance with the present invention, advantageously reduces the amount of air that is trapped by the underfill. This is accomplished by heating the substrate to an elevated temperature prior to dispensing the underfill. In addition, the process can be enhanced by heating the underfill as it is dispensed on the substrate, and by heating the semiconductor die when placing the die on the substrate.

Figure 5:
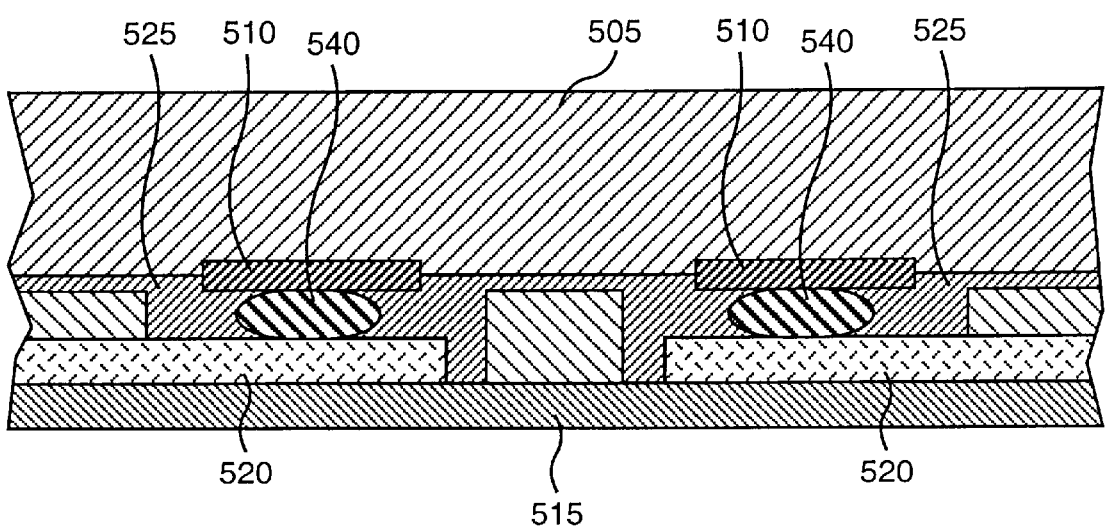
FIG. 5 shows a cross-sectional view of a die and a substrate after assembly in accordance with the method in FIG. 4.

In FIG. 5, a semiconductor die 505 with pads 510, a substrate 515 having conductors 520, and underfill 525, forms a flip chip semiconductor package 530 in accordance with the present invention. Interconnects 540 couple the die pads 510 and the conductors 520, and the underfill 525 fills the space between the die 505 and the substrate 515, without any appreciable voids.

Figure 6:
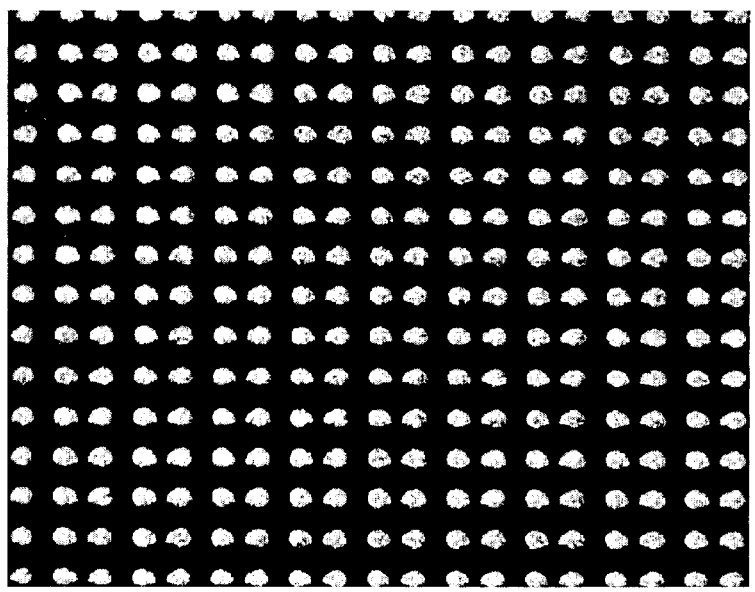
FIG. 6 shows a photograph of the substrate in FIG. 5 after dispensing underfill in accordance with the method in FIG. 4.

FIG. 6 shows a photograph of a plan view of the substrate 515 after the underfill 525 was dispensed. Here, the array of spots are the conductors 520 to which the die pads 510 are to be attached with bumps, that become interconnects 540. It will be observed that there is no appreciable indication of air bubbles as in FIG. 3. Hence, heating the substrate 515 to an elevated temperature reduces the number of voids that are formed around interconnects and conductors in the layer of no-flow underfill.

Where bumps are formed on the conductors on a substrate, underfill is disposed on the substrate, and a flipped die, with its pads aligned with the bumps, is placed on the substrate with the underfill therebetween. The assembly of semiconductor die, underfill and substrate is then reflowed, i.e. heated, and the bumps form interconnects between the conductors and the pads. In accordance with the present invention, the substrate, with the bumps, is heated to an elevated temperature prior to dispensing the underfill. Next, the underfill is dispensed, and the underfill gets heated and flows over the mask portions and around the bumps, filling in the spaces between the conductors and the mask portions, and around the bumps. Consequently, less air is trapped by the layer of underfill, and this results in less voids in the complete semiconductor package. Therefore, the present invention, as described, can be applied to a flip chip package where the bumps are on the substrate.

The present invention, as described, provides a flip chip package which has a lower density of voids in the underfill.

This is accomplished by heating the substrate and/or underfill, prior to dispensing underfill on the substrate, thus reducing the viscosity of the underfill. The relatively less viscous underfill, flows over mask portions of the substrate, onto the surface of downset conductors, and into spaces between the conductors and mask portions, and thereby preventing air from being trapped in these spaces. In addition, the layer of less viscous underfill readily flows around bumps on the die, when the die is also heated and placed on the substrate with the underfill thereon, preventing air from being trapped around the bumps.

The present invention provides a method for producing a flip chip semiconductor package which overcomes or at least reduces the abovementioned problems of the prior art.

It will be appreciated that although only one particular embodiment of the invention has been described in detail, various modifications and improvements can be made by a person skilled in the art without departing from the scope of the present invention.

What is claimed is:

1. A method for forming a flip-chip semiconductor package, the method comprising the steps of:
  a) providing:
    i) a semiconductor die having a plurality of pads thereon, wherein the pads are arranged in a pattern, and wherein at least some of the plurality pads has at least one conductive bump thereon;
    ii) a substrate having a plurality of conductive locations thereon, wherein at least some of the plurality of conductive locations are arranged in a corresponding pattern, the at least some of the plurality of conductive locations for receiving at least some of the bumps; and
    iii) underfill;
  b) heating the substrate to an elevated temperature relative to the temperature of the underfill while dispensing the underfill on the substrate; and
  c) placing the semiconductor die on the substrate with the underfill therebetween, wherein the at least some of the plurality of pads are substantially aligned with the at least some of the plurality of conductive locations.

2. A method in accordance with claim 1 wherein step (b) comprises the steps of:
  heating the substrate to the elevated temperature; and
  subsequently dispensing the underfill on the heated substrate.

3. A method in accordance with claim 2 wherein the step of dispensing is only performed after the substrate is at the elevated temperature.

4. A method in accordance with claim 3 further comprising the step of maintaining the substrate at the elevated temperature while dispensing the underfill.

5. A method in accordance with claim 4 wherein the step of heating the substrate and maintaining the substrate at the elevated temperature comprises the step of heating and maintaining the substrate at a temperature at which the underfill has a viscosity of approximately 25 Centipoises.

6. A method in accordance with claim 4 wherein the step of heating the substrate and maintaining the substrate at the elevated temperature comprises the step of heating and maintaining the substrate at a temperature of approximately 80 to 100 degrees Celsius.

7. A method in accordance with claim 1 further comprising the step of heating the semiconductor die while performing step (c).

8. A method in accordance with claim 1 further comprising the step of heating the semiconductor die prior to step (c).

9. A method in accordance with claim 1 further comprising, after step (c) the step of heating the semiconductor die, substrate and underfill assembly.

10. A method in accordance with claim 9 wherein the step of heating the semiconductor die, substrate and underfill assembly comprises the step of causing the bumps to become interconnects between the at least some of the plurality of conductive locations and the at least some of the plurality of pads.

11. A method in accordance with claim 10 wherein the step of heating the semiconductor die, substrate and underfill assembly further comprises the step of curing the underfill.

12. A method in accordance with claim 2, further comprising the step of heating the underfill prior to the step of dispensing.

13. A method in accordance with claim 12, further comprising the step of heating the underfill while dispensing the underfill.

14. A method in accordance with claim 2, further comprising the step of heating the underfill while dispensing the underfill.

15. A method in accordance with claim 1 wherein the step of dispensing the underfill in step (b) comprises the step of printing the underfill.

16. A method for forming a flip-chip semiconductor package, the method comprising the steps of:
  a) providing:
    i) a semiconductor die having a plurality of pads thereon, wherein at least some of the plurality of pads are arranged in a pattern;
    ii) a bumped substrate having a plurality of conductive locations thereon, wherein at least some of the plurality of conductive locations are arranged in a corresponding pattern, and wherein at least some of the plurality of conductive locations has at least one conductive bump thereon, the at least some of the plurality of conductive locations for coupling to at least some of the plurality of pads; and
    iii) underfill;
  b) heating the bumped substrate to an elevated temperature relative to the temperature of the underfill while dispensing the underfill on the bumped substrate; and
  c) placing the semiconductor die on the bumped substrate with the underfill therebetween, wherein the at least some of the plurality of pads are substantially aligned with the at least some conductive locations.

17. A method in accordance with claim 16 wherein step (b) comprises the steps of:
  heating the bumped substrate to the elevated temperature; and
  subsequently dispensing the underfill on the heated bumped substrate.

18. A method in accordance with claim 17 wherein the step of dispensing is only performed after the bumped substrate is at the elevated temperature.

19. A method in accordance with claim 18 further comprising the step of maintaining the bumped substrate at the elevated temperature while dispensing the underfill.

20. A method in accordance with claim 19 wherein the step of heating the bumped substrate and maintaining the bumped substrate at the elevated temperature comprises the step of heating and maintaining the bumped substrate at a temperature at which the viscosity of the underfill is approximately 25 Centipoises.

21. A method in accordance with claim 19 wherein the step of heating the bumped substrate and maintaining the bumped substrate at the elevated temperature comprises the step of heating and maintaining the bumped substrate at a temperature of approximately 80 to 100 degrees Celsius.

22. A method in accordance with claim 16 further comprising the step of heating the semiconductor die while performing step (c).

23. A method in accordance with claim 16 further comprising the step of heating the semiconductor die prior to step (c).

24. A method in accordance with claim 16 further comprising, after step (c) the step of heating the semiconductor die, substrate and underfill assembly.

25. A method in accordance with claim 24 wherein the step of heating the semiconductor die, substrate and underfill assembly comprises the step of causing the bumps to become interconnects between the at least some of the plurality of conductive locations and the at least some of the plurality of pads.

26. A method in accordance with claim 24 wherein the step of heating the semiconductor die, substrate and underfill assembly further comprises the step of curing the underfill.

27. A method in accordance with claim 17, further comprising the step of heating the underfill prior to the step of dispensing.

28. A method in accordance with claim 27, further comprising the step of heating the underfill while dispensing the underfill.

29. A method in accordance with claim 17, further comprising the step of heating the underfill while dispensing the underfill.

30. A method in accordance with claim 16 wherein the step of dispensing the underfill in step (b) comprises the step of printing the underfill.

* * * * *